(12) United States Patent
Wang et al.

(10) Patent No.: US 9,613,948 B1
(45) Date of Patent: Apr. 4, 2017

(54) ELECTROSTATIC DISCHARGE PROTECTION SEMICONDUCTOR DEVICE

(71) Applicant: UNITED MICROELECTRONICS CORP., Hsin-Chu (TW)

(72) Inventors: Jhih-Ming Wang, Yunlin County (TW); Li-Cih Wang, Taoyuan (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/273,682

(22) Filed: Sep. 22, 2016

(51) Int. Cl.
H01L 27/00 (2006.01)
H01L 27/02 (2006.01)
H01L 29/06 (2006.01)
H01L 29/423 (2006.01)
H01L 29/78 (2006.01)

(52) U.S. Cl.
CPC ...... H01L 27/0266 (2013.01); H01L 27/0248 (2013.01); H01L 29/0649 (2013.01); H01L 29/42376 (2013.01); H01L 29/7835 (2013.01)

(58) Field of Classification Search
CPC ............. H01L 27/0266; H01L 29/7835; H01L 27/0248
See application file for complete search history.

(56) References Cited

U.S. PATENT DOCUMENTS

| | | | |
|---|---|---|---|
| 6,660,602 B1 | 12/2003 | Vashchenko et al. | |
| 2014/0210007 A1* | 7/2014 | Deval | H01L 29/7393 257/350 |
| 2014/0253224 A1* | 9/2014 | Chan | H01L 29/66477 327/535 |
| 2015/0048449 A1* | 2/2015 | Jeon | H01L 29/7816 257/337 |
| 2015/0200295 A1* | 7/2015 | Prabhakar | H01L 29/7835 257/344 |
| 2015/0325651 A1* | 11/2015 | Yao | H01L 29/7835 257/339 |
| 2015/0364471 A1* | 12/2015 | Chang | H01L 29/7816 257/338 |
| 2015/0371985 A1* | 12/2015 | Edwards | H01L 27/0262 257/124 |

(Continued)

OTHER PUBLICATIONS

Huang et al., Title of Invention: Semiconductor Structure for Electrostatic Discharge Protection, U.S. Appl. No. 15/247,134, filed Aug. 25, 2016.

*Primary Examiner* — Ngan Ngo
(74) *Attorney, Agent, or Firm* — Winston Hsu; Scott Margo

(57) ABSTRACT

An ESD protection semiconductor device includes a substrate, a first isolation structure formed in the substrate, a gate disposed on the substrate, a source region formed in the substrate a first side of the gate, a first doped region formed in the substrate at a second side of the gate opposite to the first side, and a drain region formed in the first doped region. The gate overlaps a portion of the first isolation structure. The drain region is spaced apart from the first isolation by a portion of the first doped region. The substrate includes a first conductivity type, the source region, and the first doped region and the drain region include a second conductivity type. And the second conductivity type is complementary to the first conductivity type.

20 Claims, 10 Drawing Sheets

(56) References Cited

U.S. PATENT DOCUMENTS

| | | | |
|---|---|---|---|
| 2016/0027773 A1* | 1/2016 | Chen | H01L 27/088 257/337 |
| 2016/0035823 A1* | 2/2016 | Chen | H01L 29/0619 257/328 |
| 2016/0148921 A1* | 5/2016 | Mallikararjunaswamy | H01L 27/0259 257/491 |
| 2016/0172485 A1* | 6/2016 | Yanagi | H01L 27/0207 257/343 |
| 2016/0247804 A1* | 8/2016 | Harada | H01L 27/0922 |
| 2016/0268251 A1* | 9/2016 | Hwang | H01L 29/42368 |

* cited by examiner

US 9,613,948 B1

ELECTROSTATIC DISCHARGE PROTECTION SEMICONDUCTOR DEVICE

BACKGROUND OF THE INVENTION

1. Field of the Invention

The present invention relates to an electrostatic discharge (hereinafter abbreviated as ESD) protection semiconductor device, more particularly, to an ESD protection semiconductor device with improved robustness.

2. Description of the Prior Art

With the advancement of technology, the development of semiconductor process is ongoing. A modern chip is therefore allowed to have a plurality of various electronic circuits configured within. For example, the integrated circuits (ICs) integrated in the chip(s) can be divided into core circuits and input/output (hereinafter abbreviated as I/O) circuits, and the core circuits and the I/O circuits are respectively driven by different power supply sources with different voltages. And for receiving the externally provided power, pads for core circuits and I/O circuits are required.

However, it is found that electrostatic charges are easily transferred to the inner circuits in the chip by those pads during processes such as manufacturing, testing, packaging, and delivering, etc. The electrostatic charges impact and damage the inner circuits in the chip, and this unwanted condition is named electrostatic discharge (ESD). As products based on ICs become more delicate, they also become more vulnerable to the impacts from external environment. And thus, it is assumed that ESD is a constant threat to the modern electronics. Models related to ESD tolerance are divided into human body model (HBM) and machine model (MM). For commercial IC products, the general ESD specification is required that IC products must pass these tests, for example, MM ESD tolerance greater than 200V and HBM ESD tolerance greater than 2 kV.

Furthermore, electric fields generated during operation are often crowded between the isolation structure and the drain region of the ESD protection device. This electric field crowding effect even causes soft-leakage issue, and thus robustness of the ESD device is adversely impacted. Therefore, an improved ESD protection semiconductor device is needed to solve the aforementioned deficiency.

SUMMARY OF THE INVENTION

According to the claimed invention, an ESD protection semiconductor device is provided. The ESD protection semiconductor device includes a substrate, a first isolation structure formed in the substrate, a gate disposed on the substrate, a source region formed in the substrate at a first side of the gate, a first doped region formed in the substrate at a second side of the gate opposite to the first side, and a drain region formed in the first doped region. The gate overlaps a portion of the first isolation structure. The drain region is spaced apart from the first isolation structure by a portion of the first doped region. The substrate includes a first conductivity type, the source region, and the first doped region and the drain region include a second conductivity type. And the second conductivity type is complementary to the first conductivity type.

According to the semiconductor devices provided by the present invention, the drain region is spaced apart from the first isolation structure by a portion of the first doped region. Accordingly, the electric field is pushed away from the edge of the gate. In other words, the semiconductor device provided by the present invention efficiently avoids the maximum electric fields crowding between the drain region and the first isolation structure. Therefore, soft-leakage issue is avoided and thus stability and robustness of the provided ESD protection semiconductor device are both improved.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", in on and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
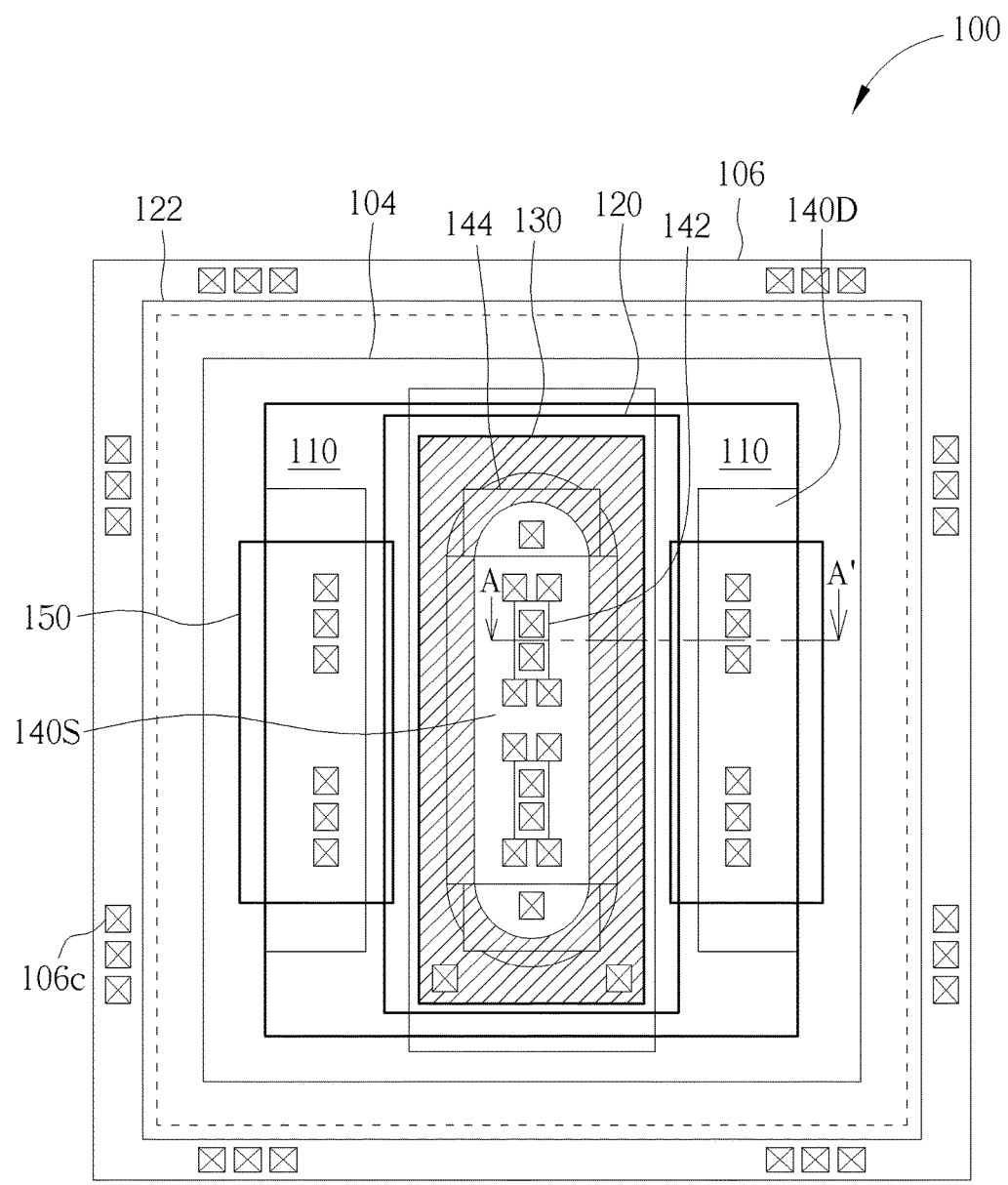
FIG. 1 is a schematic drawing illustrating a layout structure of an ESD protection semiconductor device provided by a first preferred embodiment of the present invention.
Figure 2:
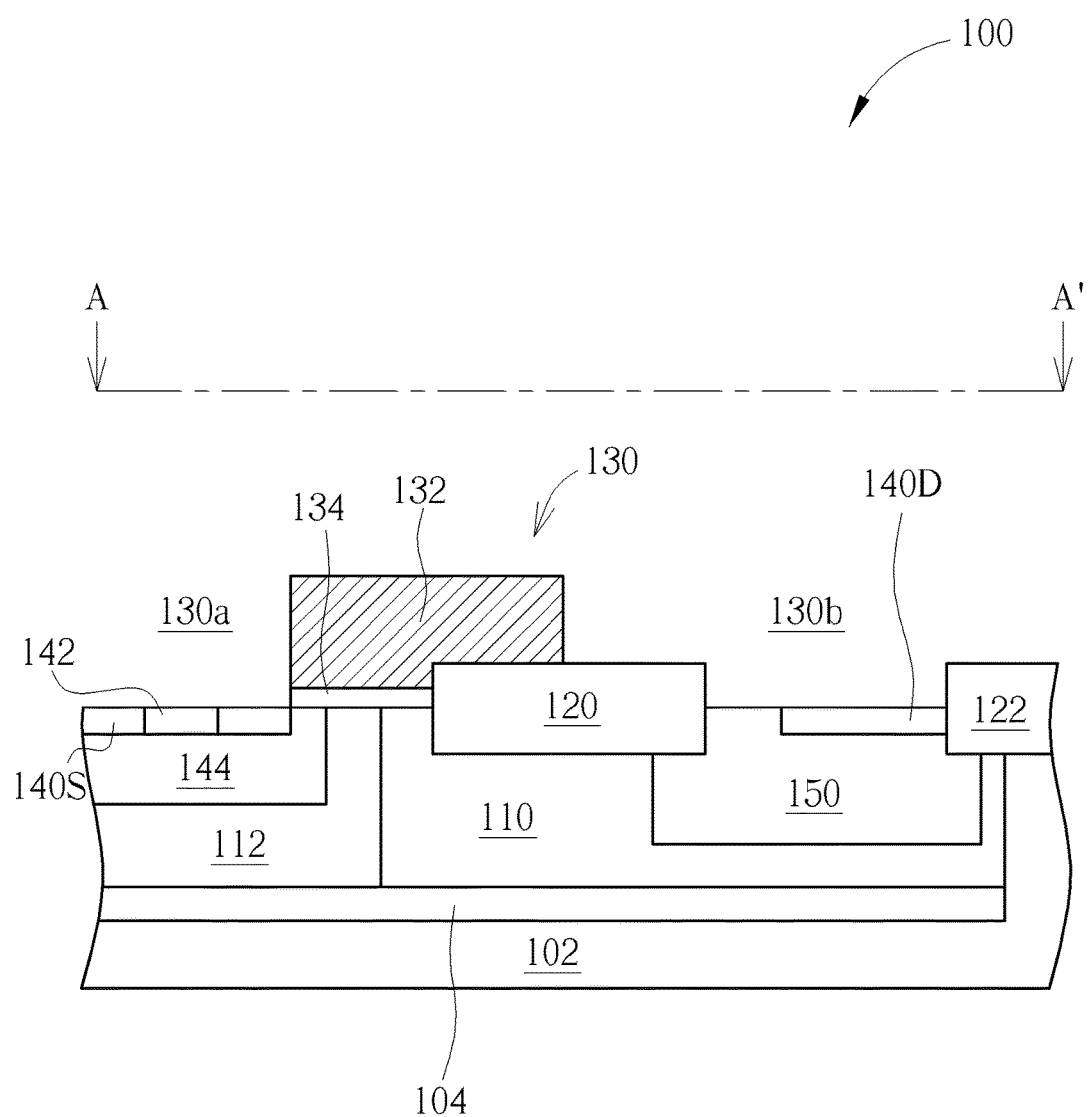
FIG. 2 is a schematic drawing illustrating the ESD protection semiconductor device provided by the first preferred embodiment and is a cross-sectional view take along Line A-A' of FIG. 1.

Please refer to FIGS. 1-2, wherein FIG. 1 is a schematic drawing illustrating a layout structure of an ESD protection semiconductor device provided by a first preferred embodiment of the present invention, and FIG. 2 is a schematic drawing illustrating the ESD protection semiconductor device provided by the first preferred embodiment and is a cross-sectional view take along Line A-A' of FIG. 1. As shown in FIGS. 1-2, the ESD protection semiconductor device 100 provided by the preferred embodiment includes a substrate 102, and the substrate 102 includes a first conductivity type. A buried layer 104 is formed in the substrate 102 as shown in FIGS. 1-2. The buried layer 104 includes a second conductivity type, and the second conductivity type is complementary to the first conductivity type. In some embodiments of the present invention, the first conductivity type is a p type and the second conductivity type is an n type. However those skilled in the art would easily realize that the first conductivity type can be an n type and the second conductivity type can be a p type. Additionally, the ESD protection semiconductor device 100 can further include a guard ring 106 (shown in FIG. 1) having the first conductivity type, and a plurality of plugs are formed in the guard ring 106. The ESD protection semiconductor device 100 further includes a first deep well 110 formed in the substrate 102 and a second deep well 112 formed in the substrate 102. As shown in FIG. 2, a bottom of the first deep well 110 and a bottom of the second deep well 112 contact the buried layer 104. The first deep well 110 includes the second conductivity type while the second deep well 112 includes the first conductivity type.

Please still refer to FIGS. 1-2. The ESD protection semiconductor device 100 provided by the preferred embodiment includes a first isolation structure 120 and a second isolation structure 122 formed in the substrate 102. In some embodiments of the present invention, the first isolation structure 120 and the second isolation structure 122 can include field oxide (hereinafter abbreviated as FOX) structure as shown in FIG. 2, but not limited to this. For example in other embodiments of the present invention, the first isolation structure 120 and the second isolation structure 122 can include shallow trench isolation (hereinafter abbreviated as STI). The ESD protection semiconductor device 100 further includes a gate 130 disposed on the substrate 102. It is noteworthy that the gate 130 overlaps a portion of the first isolation structure 120, as shown in FIGS. 1-2. The gate 130 includes a gate conductive layer 132 and a gate dielectric layer 134 (shown in FIG. 2). Since materials for forming the gate conductive layer 132 and the gate dielectric layer 134 are well-known to those skilled in the art, those details are omitted in the interest of brevity. The ESD protection semiconductor device 100 includes a source region 140S formed in the substrate 102. More particularly, the source region 140S is formed in the second deep well 112. As shown in FIG. 2, the source region 140S is formed at a first side 130a of the gate 130. The ESD protection semiconductor device 100 further includes a doped region 150 and a drain region 140D formed in the substrate 102, and more particularly, the drain region 140D is formed in the doped region 150, and the doped region is formed in the first deep well 110. As shown in FIG. 2, the drain region 140D and the doped region 150 are formed at a second side 130b of the gate 130 opposite to the first side 130a. It is noteworthy that in some embodiments of the present invention that the gate 130 includes a racetrack-shaped gate as shown in FIG. 1, therefore the first side 130a is an inner side of the racetrack-shaped gate 130, and the second side 130b is an outer side of the racetrack-shaped gate 130. As shown in FIGS. 1-2, both of the doped region 150 and the drain region 140D are disposed in between the first isolation structure 120 and the second isolation structure 122. It is noteworthy that the drain region 140D is spaced apart from the first isolation structure 120 by a portion of the doped region 150 as shown in FIGS. 1-2. Also, the drain region 140D is spaced apart from the substrate 102 and the first deep well 110 by a portion of the doped region 150. However, in the preferred embodiment, the drain region 140D contacts the second isolation structure 122 as shown in FIGS. 1-2. The doped region 150, the drain region 140D and the source region 140S include the second conductivity type. It is noteworthy that a concentration of doped region 150 is smaller than a concentration of the drain region 140D and a concentration of the source region 140S, but larger than a concentration of the first deep well 110.

Please still refer to FIGS. 1-2. The ESD protection semiconductor device 100 further includes a doped region 142 and a base region 144 formed in the substrate 102 at the first side 130a. In detail, the doped region 142 is formed in the source region 140S, and both of the doped region 142 and the source region 140S are formed in the base region 144. Furthermore, the base region 144 is formed in the second deep well 112 as shown in FIGS. 1-2. The doped region 142 and the base region 144 both include the first conductivity type, however a concentration of the doped region 142 is larger than a concentration of the base region 144.

According to the ESD protection semiconductor device 100 provided by the first preferred embodiment, the doped region 150 is provided at the drain side, and the drain region 140D is spaced apart from the first isolation structure 120 by a portion of the doped region 150. Therefore electric fields generated during operation are pushed away from the edge between the first isolation structure 120 and the drain region 140D. In other words, the doped region 150 helps to shift the electric fields away from the drain region 140D. Consequently, the ESD protection semiconductor device 100 provided by the first preferred embodiment and modification efficiently avoids the electric fields crowding effect. Therefore, soft-leakage issue is avoided and the robustness of the provided ESD protection semiconductor device 100 is improved.

Figure 3:
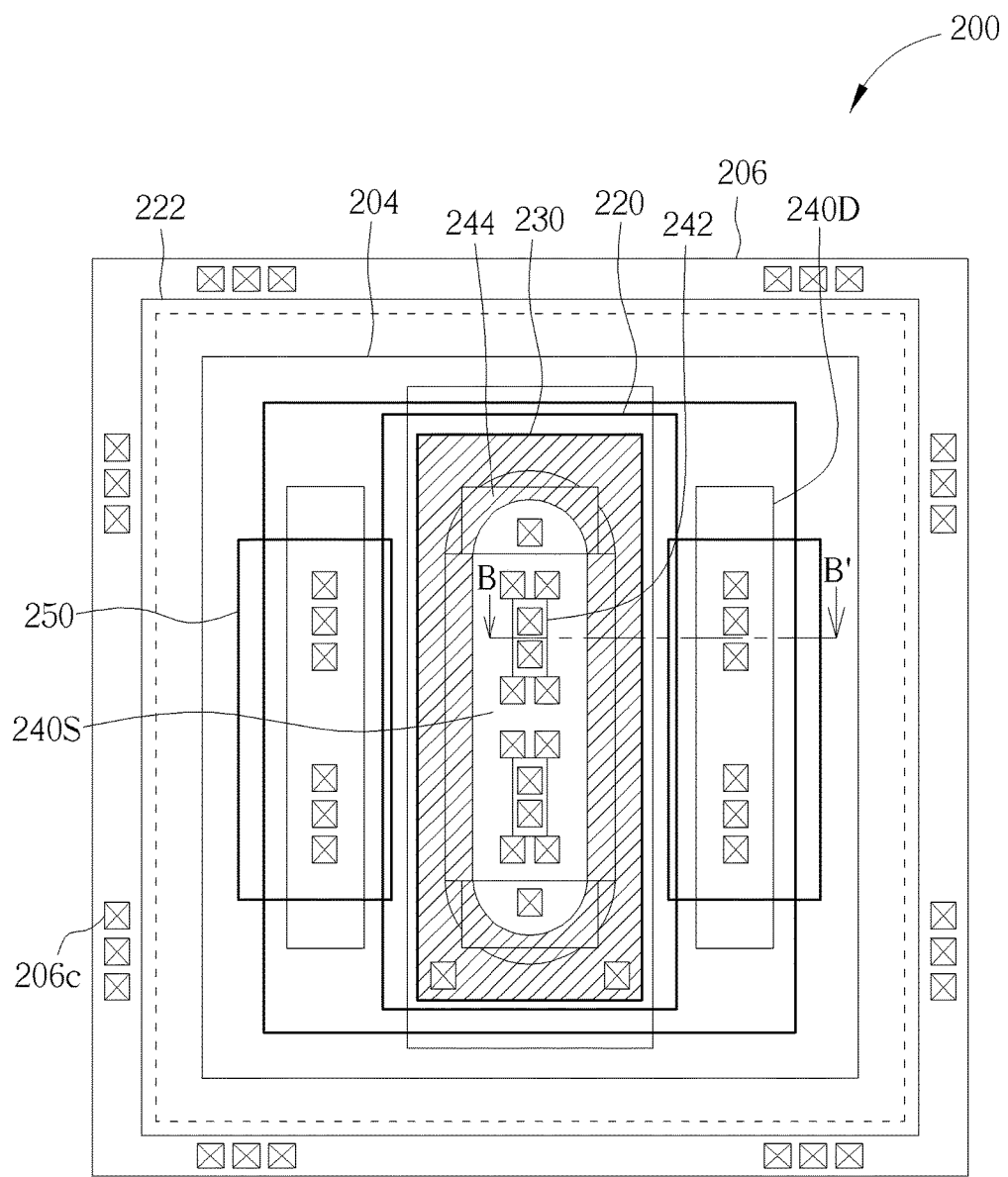
FIG. 3 is a schematic drawing illustrating a layout structure of an ESD protection semiconductor device provided by a second preferred embodiment of the present invention.
Figure 4:
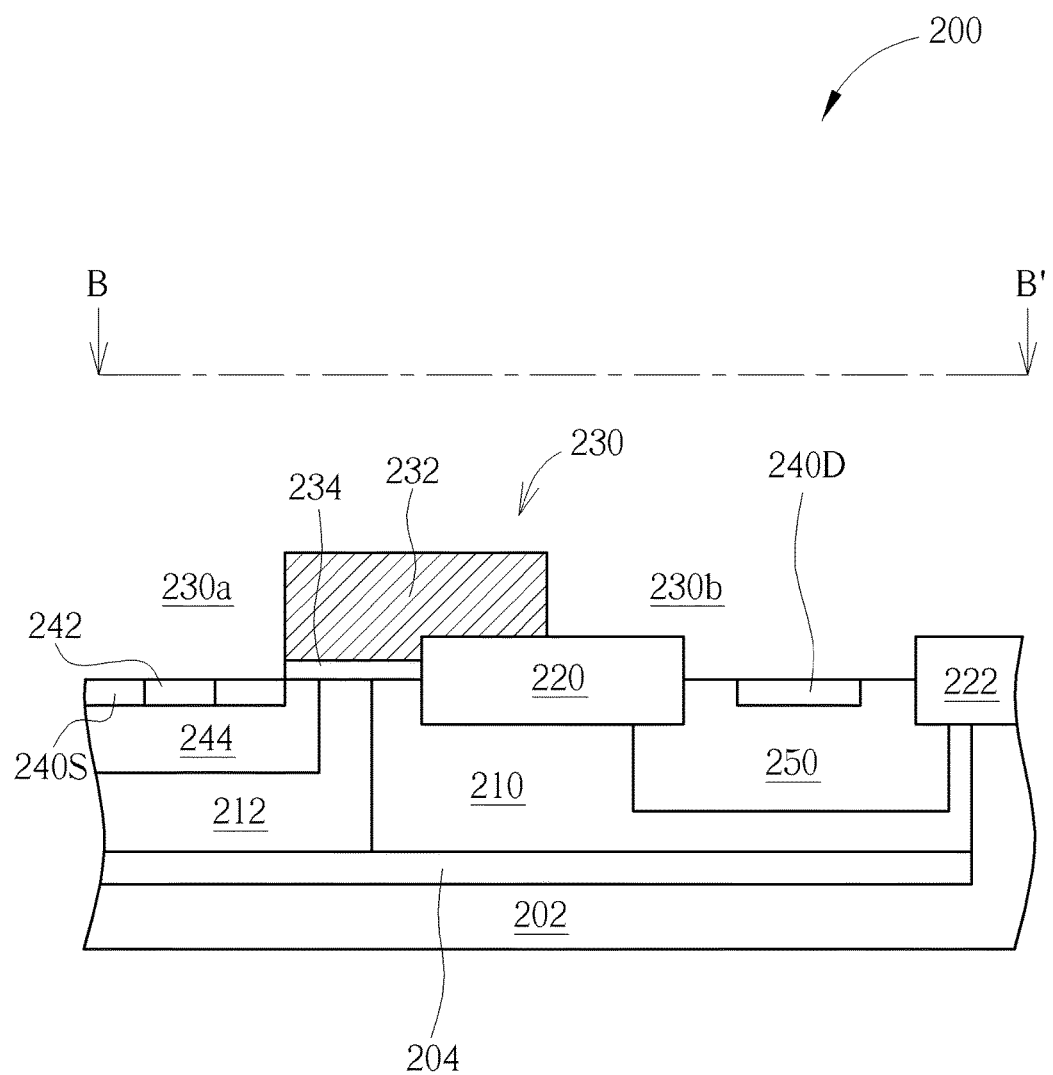
FIG. 4 is a schematic drawing illustrating the ESD protection semiconductor device provided by the second preferred embodiment and is a cross-sectional view take along Line B-B' of FIG. 3.

Please refer to FIGS. 3-4, wherein FIG. 3 is a schematic drawing illustrating a layout structure of an ESD protection semiconductor device provided by a second preferred embodiment of the present invention, and FIG. 4 is a schematic drawing illustrating the ESD protection semiconductor device provided by the second preferred embodiment and is a cross-sectional view take along Line B-B' of FIG. 3. As shown in FIGS. 3-4, the ESD protection semiconductor device 200 provided by the preferred embodiment includes a substrate 202, and the substrate 202 includes a first conductivity type. A buried layer 204 is formed in the substrate 202 as shown in FIGS. 3-4. The buried layer 204 includes a second conductivity type, and the second conductivity type is complementary to the first conductivity type. In some embodiments of the present invention, the first conductivity type is a p type and the second conductivity type is an n type. However those skilled in the art would easily realize that the first conductivity type can be an n type and the second conductivity type can be a p type. Additionally, the ESD protection semiconductor device 200 can further include a guard ring 206 (shown in FIG. 3) having the first conductivity type, and a plurality of plugs are formed in the guard ring 206. The ESD protection semiconductor device 200 further includes a first deep well 210 formed in the substrate 202 and a second deep well 212 formed in the substrate 202. As shown in FIG. 4, a bottom of the first deep well 210 and a bottom of the second deep well 212 contact the buried layer 204. The first deep well 210 includes the second conductivity type while the second deep well 212 includes the first conductivity type.

Please still refer to FIGS. 3-4. The ESD protection semiconductor device 200 provided by the preferred embodiment includes a first isolation structure 220 and a second isolation structure 222 formed in the substrate 202. As shown in FIG. 4, the first isolation structure 220 and the second isolation structure 222 can include FOX structure, but not limited to this. The ESD protection semiconductor device 200 further includes a gate 230 disposed on the substrate 202. It is noteworthy that the gate 230 overlaps a portion of the first isolation structure 220, as shown in FIGS. 3-4. The gate 230 includes gate conductive layer 232 and a gate dielectric layer 234 (shown in FIG. 4). Since materials for forming the gate conductive layer 232 and the gate dielectric layer 234 are well-known to those skilled in the art, those details are omitted for simplicity. The ESD protection semiconductor device 200 includes a source region 240S formed in the substrate 202, and more particularly, the source region 240S is formed in the second deep well 212. As shown in FIG. 4, the source region 240S is formed at a first side 230a of the gate 230. The ESD protection semiconductor device 200 further includes a doped region 250 and a drain region 240D formed in the substrate 202, and more particularly, the drain region 240D is formed in the doped region 250, and the doped region 250 is formed in the first deep well 210. As shown in FIG. 4, the drain region 240D and the doped region 250 are formed at a second side 230b of the gate 230 opposite to the first side 230a. It is noteworthy that in some embodiments of the present invention that the gate 230 includes a racetrack-shaped gate as shown in FIG. 3, the first side 230a is an inner side of the racetrack-shaped gate 230, and therefore the second side 230b is an outer side of the racetrack-shaped gate 230. As shown in FIGS. 3-4, both of the doped region 250 and the drain region 240D are disposed in between the first isolation structure 220 and the second isolation structure 222. It is noteworthy that the drain region 240D is spaced apart from both of the first isolation structure 220 and the second isolation structure 222 by a portion of the doped region 250 as shown in FIGS. 3-4. Also, the drain region 240D is spaced apart from the substrate 202 and the first deep well 210 by a portion of the doped region 250. The doped region 250, the drain region 240D and the source region 240S include the second conductivity type. It is noteworthy that a concentration of the doped region 250 is smaller than a concentration of the drain region 240D and a concentration of the source region 240S, but larger than a concentration of the first deep well 210.

Please still refer to FIGS. 3-4. The ESD protection semiconductor device 200 further includes a doped region 242 and a base region 244 formed in the substrate 202 at the first side 230a. In detail, the doped region 242 is formed in the source region 240S, and both of the doped region 242 and the source region 240S are formed in the base region 244. Furthermore, the base region 244 is formed in the second deep well 212 as shown in FIGS. 3-4. The doped region 242 and the base region 244 both include the first conductivity type, however a concentration of the doped region 242 is larger than a concentration of the base region 244.

According to the ESD protection semiconductor device 200 provided by the second preferred embodiment, the doped region 250 is provided at the drain side, and the drain region 240D is spaced apart from both of the first isolation structure 220 and the second isolation structure 222 by a portion of the doped region 250. Therefore electric fields generated during operation are pushed away from the edge between the first isolation structure 220 and the drain region 240D. In other words, the doped region 250 helps to shift the electric fields away from the drain region 240D. Consequently, the ESD protection semiconductor device 200 provided by the second preferred embodiment and modification efficiently avoids the electric fields crowding effect. Therefore, soft-leakage issue is avoided and the robustness of the provided ESD protection semiconductor device 200 is improved.

Figure 5:
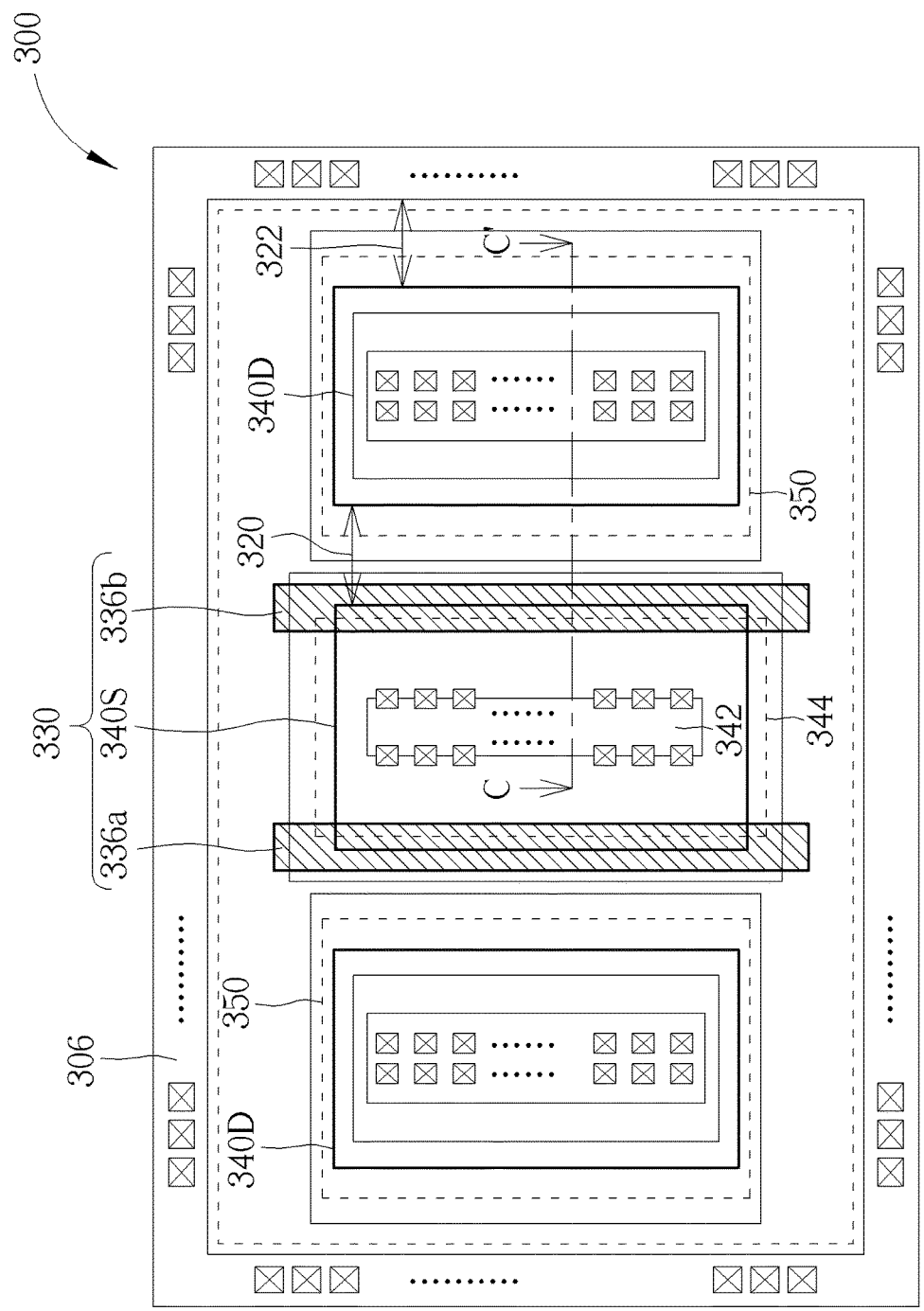
FIG. 5 is a schematic drawing illustrating a layout structure of an ESD protection semiconductor device provided by a third preferred embodiment of the present invention.
Figure 6:
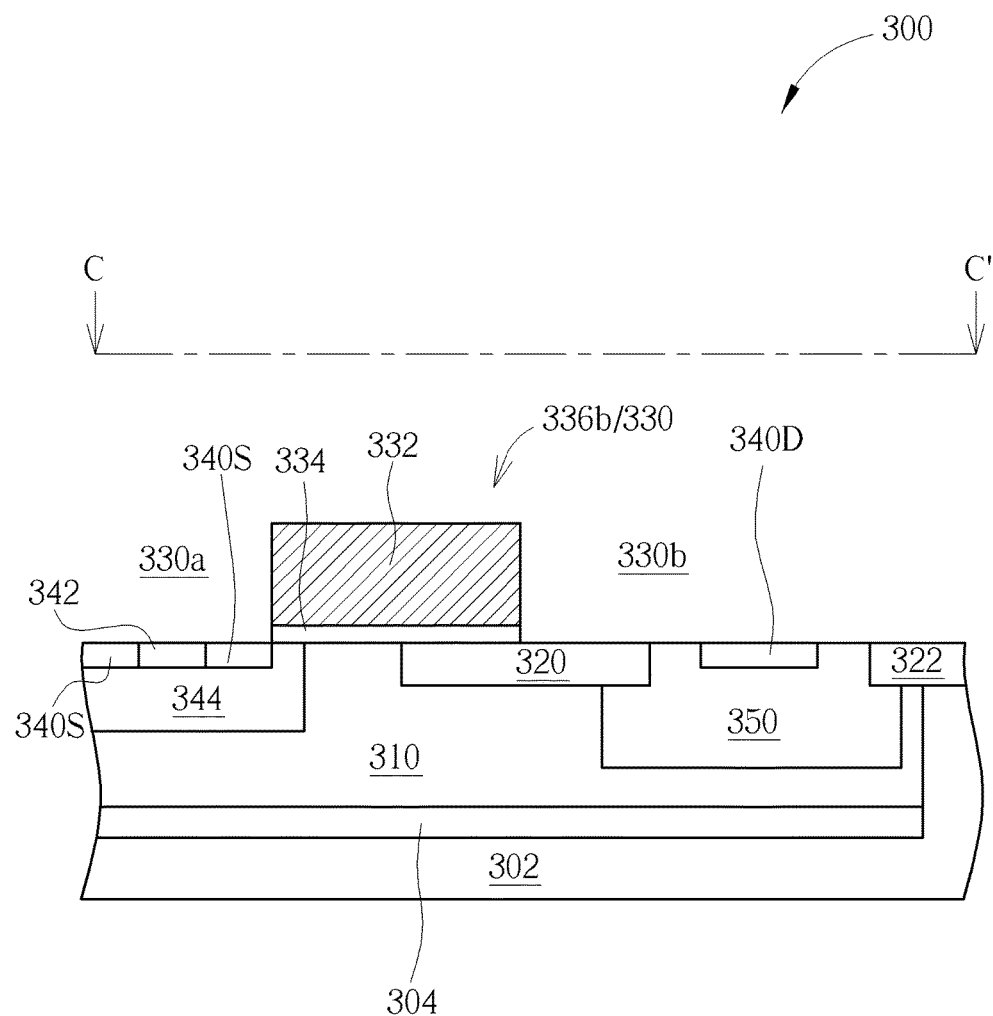
FIG. 6 is a schematic drawing illustrating the ESD protection semiconductor device provided by the third preferred embodiment and is a cross-sectional view take along Line C-C' of FIG. 5.

Please refer to FIGS. 5-6, wherein FIG. 5 is a schematic drawing illustrating a layout structure of an ESD protection semiconductor device provided by a third preferred embodiment of the present invention, and FIG. 6 is a schematic drawing illustrating the ESD protection semiconductor device provided by the third preferred embodiment and is a cross-sectional view take along Line C-C' of FIG. 5. As shown in FIGS. 5-6, the ESD protection semiconductor device 300 provided by the preferred embodiment includes a substrate 302, and the substrate 302 includes a first conductivity type. A buried layer 304 (shown in FIG. 6) is formed in the substrate 302. The buried layer 304 includes a second conductivity type, and the second conductivity type is complementary to the first conductivity type. In some embodiments of the present invention, the first conductivity type is a p type and the second conductivity type is an n type. However as mentioned above, the first conductivity type can be an n type and the second conductivity type can be a p type. Additionally, the ESD protection semiconductor device 300 can further include a guard ring 306 (shown in FIG. 5) having the first conductivity type, and a plurality of plugs are formed in the guard ring 306. The ESD protection semiconductor device 300 further includes a deep well 310 formed in the substrate 302 as shown in FIG. 6, and the deep well 310 includes the second conductivity type.

Please still refer to FIGS. 5-6. The ESD protection semiconductor device 300 provided by the preferred embodiment includes a first isolation structure 320 and a second isolation structure 322 formed in the substrate 302. In some embodiments of the present invention, the first isolation structure 320 and the second isolation structure 322 can include (STI structure, but not limited to this. The ESD protection semiconductor device 300 further includes a gate 330 disposed on the substrate 302. It is noteworthy that the gate 330 overlaps a portion of the first isolation structure 320, as shown in FIGS. 5-6. It is noteworthy that in the preferred embodiment, the gate 330 includes a first gate line 336a and a second gate line 336b. The first gate line 336a and the second gate line 336b respectively include a gate conductive layer 332 and a gate dielectric layer 334 (shown in FIG. 6). As mentioned above, materials for forming the gate conductive layer 332 and the gate dielectric layer 334 are omitted for simplicity. The ESD protection semiconductor device 300 includes a source region 340S formed in the substrate 302, and more particularly, the source region 340S is formed at a first side 330a of the gate 330. The ESD protection semiconductor device 300 further includes a doped region 350 and a drain region 340D formed in the substrate 302, and more particularly, the drain region 340D is formed in the doped region 350. As shown in FIG. 6, the drain region 340D and the doped region 350 are formed at a second side 330b of the gate 330 opposite to the first side 330a. It is noteworthy that in some embodiments of the present invention that the gate 230 includes the first gate line 336a and the second gate line 336b as shown in FIG. 5, the source region 340S is formed in between the first gate line 336a and the second gate line 336b. In other words, the area between the first gate line 336a and the second gate line 336b is recognized as the first side 330a. As shown in FIGS. 5-6, both of the doped region 350 and the drain region 340D are disposed in between the first isolation structure 320 and the second isolation structure 322. It is noteworthy that the drain region 340D is spaced apart from both of the first isolation structure 320 and the second isolation structure 322 by a portion of the doped region 350 as shown in FIGS. 5-6. However, in a modification to the preferred embodiment, the first doped region 350 can be formed to contact the second isolation structure 322. Also, the drain region 340D is spaced apart from the substrate 302 and the deep well 310 by a portion of the doped region 350. The doped region 350, the drain region 340D and the source region 340S include the second conductivity type. It is noteworthy that a concentration of doped region 350 is smaller than a concentration of the drain region 340D and a concentration of the source region 340S, but larger than a concentration of the deep well 310.

Please still refer to FIGS. 5-6. The ESD protection semiconductor device 300 further includes a doped region 342 and a base region 344 formed in the substrate 302 at the first side 330a. In detail, the doped region 342 is formed in the source region 340S, and both the doped region 342 and the source region 340S are formed in the base region 344. In fact, the drain region 340D, the doped region 350, the source region 340S, the doped region 342 and the base region 344 are all formed in the deep well 310 as shown in FIG. 6. The doped region 342 and the base region 344 both include the first conductivity type, however a concentration of the doped region 342 is larger than a concentration of the base region 344.

According to the ESD protection semiconductor device 300 provided by the third preferred embodiment, the doped region 350 is provided at the drain side, and the drain region 340D is at least spaced apart from the first isolation structure 320 by a portion of the doped region 350. Therefore electric fields generated during operation are pushed away from the edge between the first isolation structure 320 and the drain region 340D. In other words, the doped region 350 helps to shift the electric fields away from the drain region 340D. Consequently, the ESD protection semiconductor device 300 provided by the third preferred embodiment and modification efficiently avoids the electric fields crowding effect. Therefore, soft-leakage issue is avoided and the robustness of the provided ESD protection semiconductor device 300 is improved.

Figure 7:
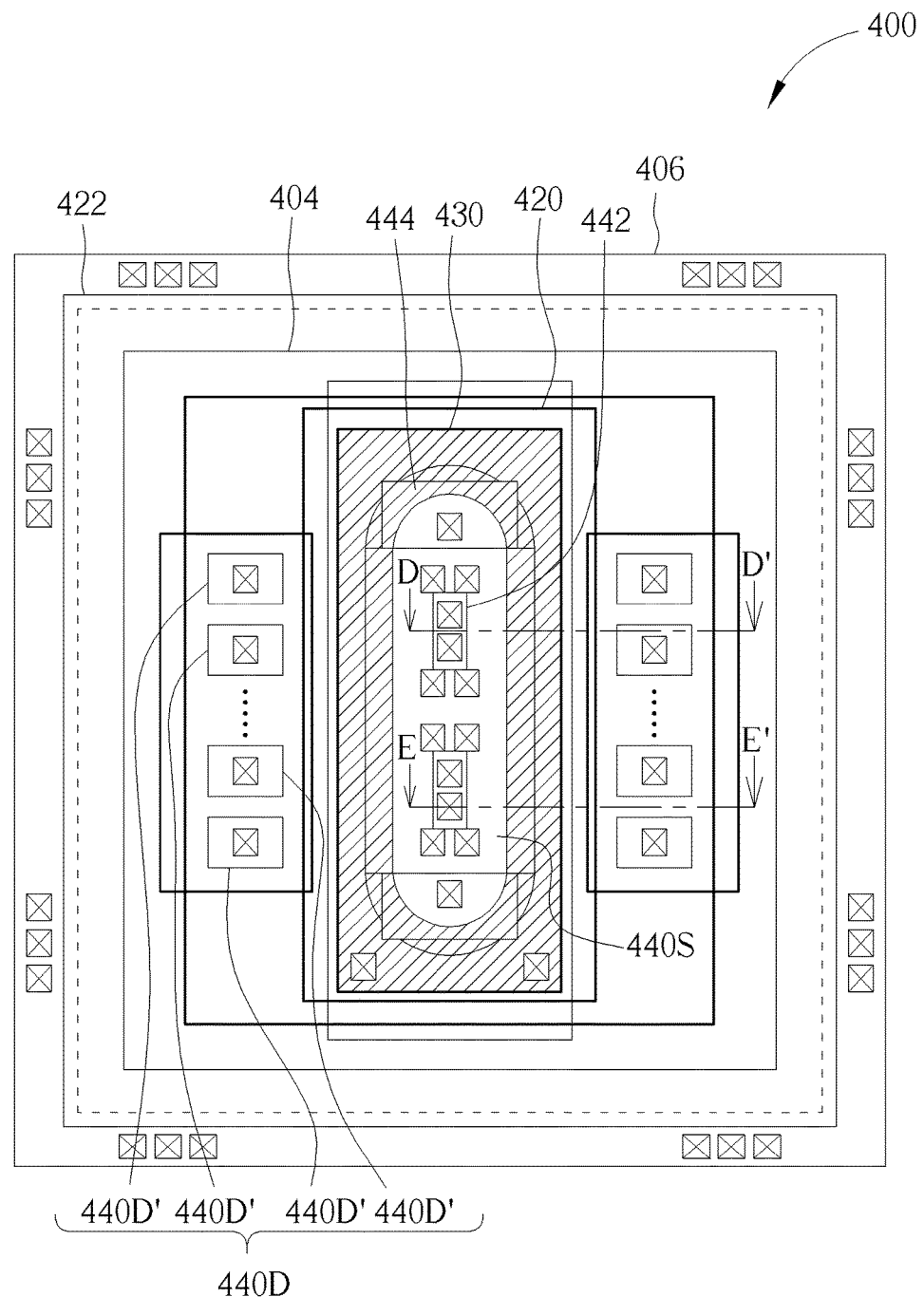
FIG. 7 is a schematic drawing illustrating a layout structure of an ESD protection semiconductor device provided by a fourth preferred embodiment of the present invention.
Figure 8:
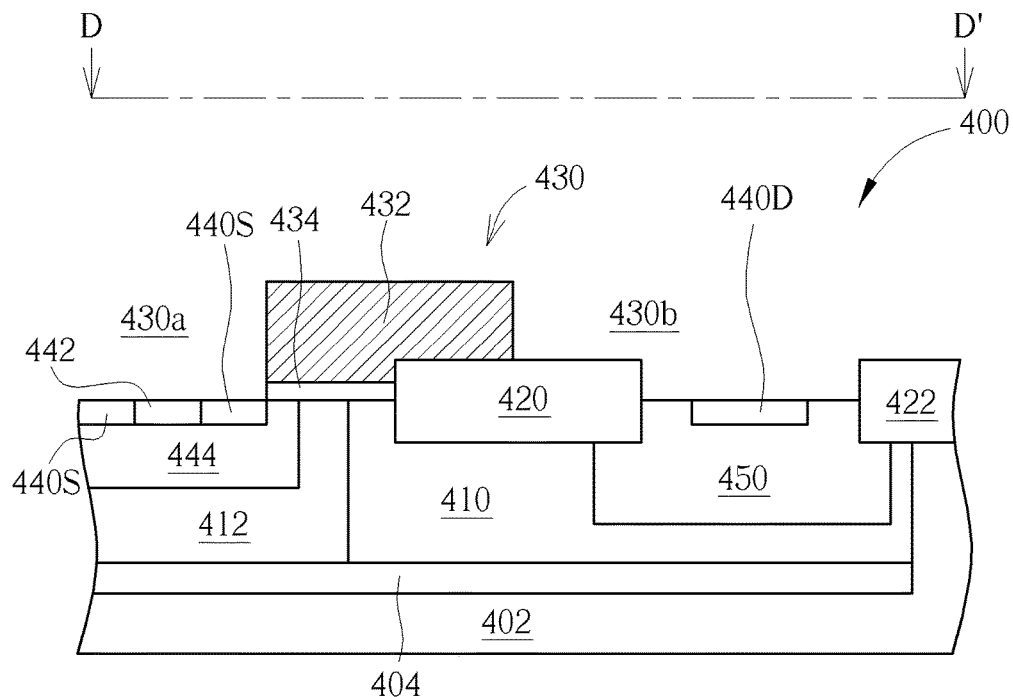
FIG. 8 is a schematic drawing illustrating the ESD protection semiconductor device provided by the fourth preferred embodiment and is a cross-sectional view take along Line D-D' of FIG. 7.
Figure 9:
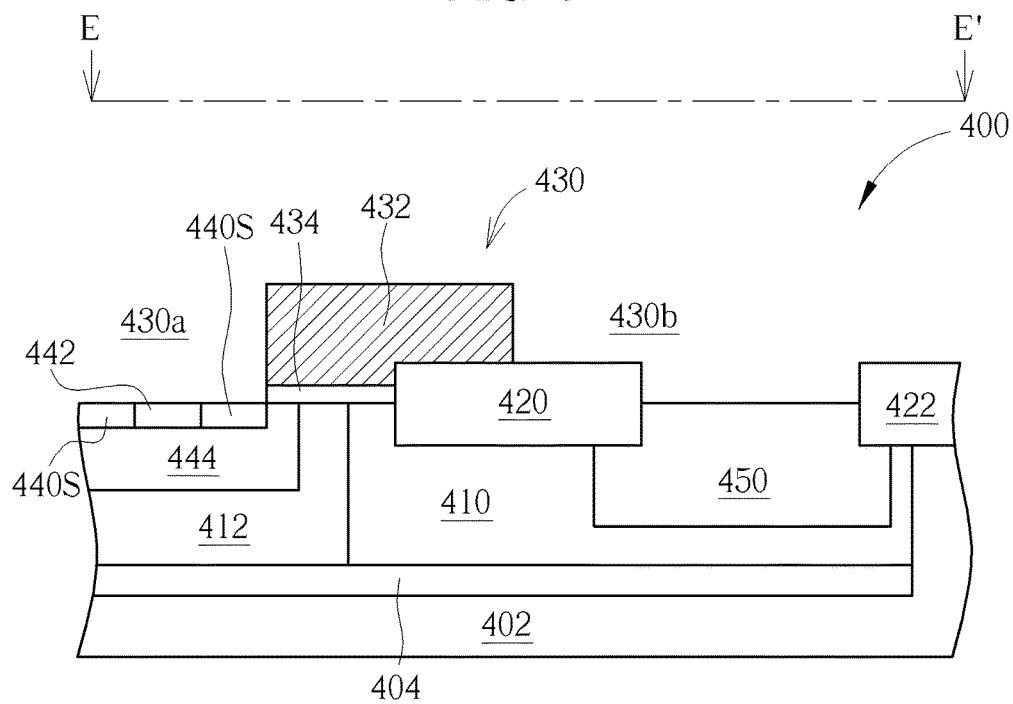
FIG. 9 is also a schematic drawing illustrating the ESD protection semiconductor device provided by the fourth preferred embodiment and is a cross-sectional view take along Line E-E' of FIG. 7.

Please refer to FIGS. 7-9, wherein FIG. 7 is a schematic drawing illustrating a layout structure of an ESD protection semiconductor device provided by a fourth preferred embodiment of the present invention, FIG. 8 is a schematic drawing illustrating the ESD protection semiconductor device provided by the fourth preferred embodiment and is a cross-sectional view take along Line D-D' of FIG. 7, and FIG. 9 is also a schematic drawing illustrating the ESD protection semiconductor device provided by the fourth preferred embodiment and is a cross-sectional view take along Line E-E' of FIG. 7. As shown in FIGS. 7-9, the ESD protection semiconductor device 400 provided by the preferred embodiment includes a substrate 402 (shown in FIGS. 8-9), and the substrate 402 includes a first conductivity type. A buried layer 404 is formed in the substrate 402. The buried layer 404 includes a second conductivity type, and the second conductivity type is complementary to the first conductivity type. In some embodiments of the present invention, the first conductivity type is a p type and the second conductivity type is an n type. However as mentioned above, the first conductivity type can be an n type and the second conductivity type can be a p type. Additionally, the ESD protection semiconductor device 400 can further include a guard ring 406 (shown in FIG. 7) having the first conductivity type, and a plurality of plugs are formed in the guard ring 406. The ESD protection semiconductor device 400 further includes a first deep well 410 formed in the substrate 402 and a second deep well 412 formed in the substrate 402. As shown in FIGS. 8-9, a bottom of the first deep well 410 and a bottom of the second deep well 412 contact the buried layer 404. The first deep well 410 includes the second conductivity type while the second deep well 412 includes the first conductivity type.

Please still refer to FIGS. 7-9. The ESD protection semiconductor device 400 provided by the preferred embodiment includes a first isolation structure 420 and a second isolation structure 422 formed in the substrate 402. As shown in FIGS. 8-9, the first isolation structure 420 and the second isolation structure 422 can include FOX structure, but not limited to this. The ESD protection semiconductor device 400 further includes a gate 430 disposed on the substrate 402. It is noteworthy that the gate 430 overlaps a portion of the first isolation structure 420, as shown in FIGS. 7-9. The gate 430 includes a gate conductive layer 432 and a gate dielectric layer 434 (shown in FIGS. 8-9). As mentioned above, materials for forming the gate conductive layer 432 and the gate dielectric layer 434 are omitted for simplicity. The ESD protection semiconductor device 400 includes a source region 440S formed in the substrate 402, and more particularly, the source region 440S is formed in the second deep well 412. As shown in FIGS. 8-9, the source region 440S is formed at a first side 430a of the gate 430. The ESD protection semiconductor device 400 further includes a doped region 450 and a drain region 440D formed in the substrate 402. According to the preferred embodiment, the drain region 440D comprising a plurality of doped islands 440D' arranged along a direction parallel with an extending direction of the gate 430. More particularly, the doped islands 440D' are all formed in the doped region 450, and spaced apart from each other by a portion of the doped region 450. And the doped region 450 is formed in the first deep well 410. As shown in FIGS. 8-9, the drain region 440D and the doped region 450 are formed at a second side 430b of the gate 430 opposite to the first side 430a. It is noteworthy that in some embodiments of the present invention that the gate 430 includes a racetrack-shaped gate as shown in FIG. 7, the first side 430a is an inner side of the racetrack-shaped gate 430, and the second side 430b is an outer side of the racetrack-shaped gate 430. As shown in FIGS. 7-9, both of the doped region 450 and the drain region 440D are disposed in between the first isolation structure 420 and the second isolation structure 422. It is noteworthy that the drain region 440D (including all of the doped islands 440D') is spaced apart from both of the first isolation structure 420 and the second isolation structure 422 by a portion of the doped region 450 as shown in FIGS. 7-9. Also, the drain region 440D (including all of the doped islands 440D') is spaced apart from the substrate 402 and the first deep well 410 by a portion of the doped region 450. However, in some modifications to the preferred embodiment, the drain region 440D (including all of the doped islands 440D') can be formed to contact the second isolation structure 422. The doped region 450, the drain region 440D and the source region 440S include the second conductivity type. It is noteworthy that a concentration of first doped region 450 is smaller than a concentration of the drain region 440D and a concentration of the source region 440S, but larger than a concentration of the first deep well 410.

Please still refer to FIGS. 7-9. The ESD protection semiconductor device 400 further includes a doped region 442 and a base region 444 formed in the substrate 402 at the first side 430a. In detail, the doped region 442 is formed in the source region 440S, and both the doped region 442 and the source region 440S are formed in the base region 444. Furthermore, the base region 444 is formed in the second deep well 412 as shown in FIGS. 7-9. The doped region 442 and the base region 444 both include the first conductivity type, however a concentration of the doped region 442 is larger than a concentration of the base region 444.

Additionally in some modification to the preferred embodiment, the gate 430 can include a first gate line (not shown) and the second gate line (not shown), and the source region 440S is formed in between the first gate line and the second gate line. Also in such modification, the ESD protection semiconductor device includes only one deep well (not shown), and the source region 440S, the doped region 442, the base region 444, the drain region 440D (including all of the doped islands 440D'), and the doped region 450 are formed in the deep well.

According to the semiconductor device 400 provided by the fourth preferred embodiment, the doped region 450 is provided at the drain side, and the drain region 440D is spaced apart from at least the first isolation structure 420 by a portion of the doped region 450. Therefore electric fields generated during operation are pushed away from the edge between the first isolation structure 420 and the drain region 440D. In other words, the doped region 450 helps to shift the electric fields away from the drain region 440D. Consequently, the ESDE protection semiconductor device 400 provided by the fourth preferred embodiment and modification efficiently avoids the electric fields crowding effect. Therefore, soft-leakage issue is avoided and the robustness of the provided ESD protection semiconductor device 400 is improved.

Figure 10:
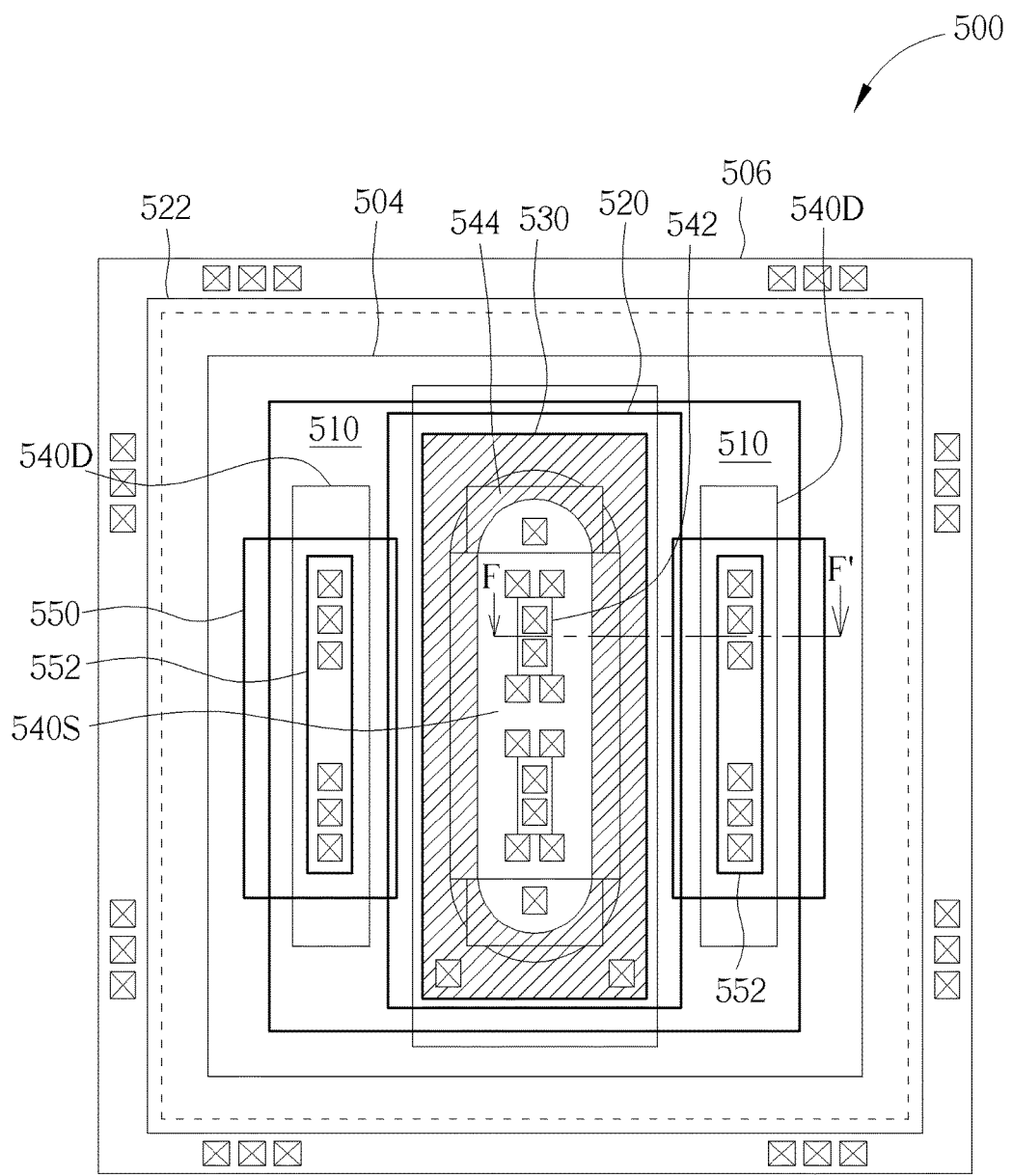
FIG. 10 is a schematic drawing illustrating a layout structure of an ESD protection semiconductor device provided by a fifth preferred embodiment of the present invention.
Figure 11:
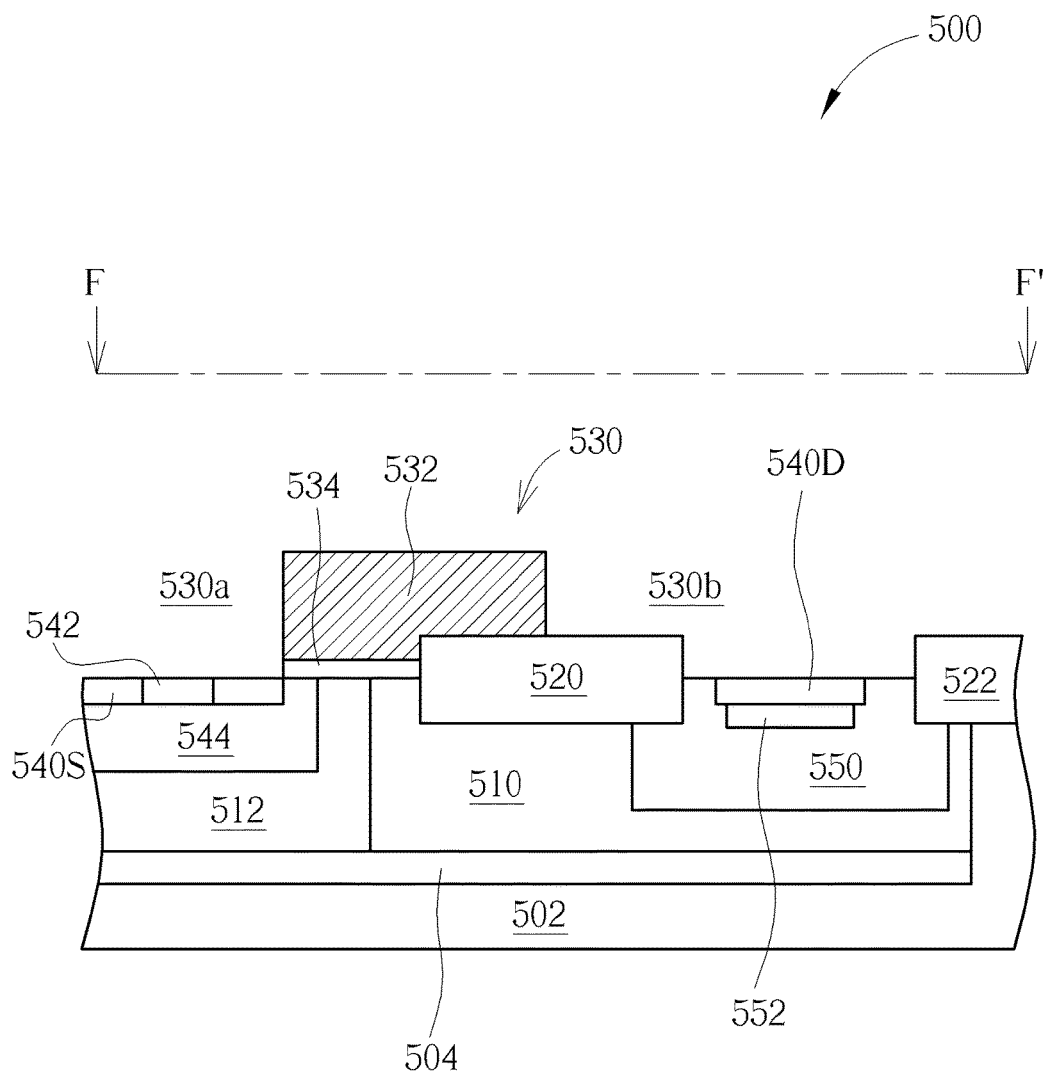
FIG. 11 is a schematic drawing illustrating the ESD protection semiconductor device provided by the fifth preferred embodiment and is a cross-sectional view take along Line F-F' of FIG. 10.

Please refer to FIGS. 10-11, wherein FIG. 10 is a schematic drawing illustrating a layout structure of an ESD protection semiconductor device provided by a fifth preferred embodiment of the present invention, and FIG. 11 is a schematic drawing illustrating the ESD protection semiconductor device provided by the fifth preferred embodiment and is a cross-sectional view take along Line F-F' of FIG. 10. As shown in FIGS. 10-11, the ESD protection semiconductor device 500 provided by the preferred embodiment includes a substrate 502 (shown in FIG. 11), and the substrate 502 includes a first conductivity type. A buried layer 504 is formed in the substrate 502. The buried layer 504 includes a second conductivity type, and the second conductivity type is complementary to the first conductivity type. In some embodiments of the present invention, the first conductivity type is a p type and the second conductivity type is an n type. However as mentioned above, the first conductivity type can be an n type and the second conductivity type can be a p type. Additionally, the ESD protection semiconductor device 500 can further include a guard ring 506 (shown in FIG. 10) having the first conductivity type, and a plurality of plugs are formed in the guard ring 506. The ESD protection semiconductor device 500 further includes a first deep well 510 formed in the substrate 502 and a second deep well 512 formed in the substrate 502. As shown in FIG. 11, a bottom of the first deep well 510 and a bottom of the second deep well 512 contact the buried layer 504. The first deep well 510 includes the second conductivity type while the second deep well 512 includes the first conductivity type.

Please still refer to FIGS. 10-11. The ESD protection semiconductor device 500 provided by the preferred embodiment includes a first isolation structure 520 and a second isolation structure 522 formed in the substrate 502. As shown in FIGS. 10-11, the first isolation structure 520 and the second isolation structure 522 can include FOX structure, but not limited to this. The ESD protection semiconductor device 500 further includes a gate 530 disposed on the substrate 502. It is noteworthy that the gate 530 overlaps a portion of the first isolation structure 520, as shown in FIGS. 10-11. The gate 530 includes a gate conductive layer 532 and a gate dielectric layer 534. As mentioned above, materials for forming the gate conductive layer 532 and the gate dielectric layer 534 are omitted for simplicity. The ESD protection semiconductor device 500 includes a source region 540S formed in the substrate 502, and more particularly, the source region 540S is formed in the second deep well 512. As shown in FIGS. 10-11, the source region 540S is formed at a first side 530a of the gate 530. The ESD protection semiconductor device 500 further includes a drain region 540D, a first doped region 550 and a second doped region 552 formed in the substrate 502. The drain region 540D and the second doped region 552 are formed in the first doped region 550, and the first doped region 550 is formed in the first deep well 510. Furthermore, the second doped region 552 is sandwiched in between a portion of the first doped region 550 and the drain region 540D in a substrate-thickness direction. As shown in FIGS. 10-11, the drain region 540D, the first doped region 550 and the second doped region 552 are formed at a second side 530b of the gate 530 opposite to the first side 530a. Please refer to FIG. 10. It is noteworthy that in some embodiments of the present invention that the gate 530 includes a racetrack-shaped gate as shown in FIG. 10, the first side 530*a* is an inner side of the racetrack-shaped gate 530, and the second side 530*b* is an outer side of the racetrack-shaped gate 530. As shown in FIGS. 10-11, the first doped region 550, the second doped region 552 and the drain region 540D are all disposed in between the first isolation structure 520 and the second isolation structure 522. It is noteworthy that the drain region 540D is spaced apart from both of the first isolation structure 520 and the second isolation structure 522 by a portion of the first doped region 550 as shown in FIGS. 10-11. Also, the drain region 540D is spaced apart from the substrate 502 and the first deep well 510 by a portion of the first doped region 550. However, in some modifications to the preferred embodiment, the drain region 540D can be formed to contact the second isolation structure 522. The first doped region 550, the drain region 540D and the source region 540S include the second conductivity type while the second doped region 552 includes the first conductivity type. It is noteworthy that a concentration of first doped region 550 is smaller than a concentration of the drain region 540D and a concentration of the source region 540S, but larger than a concentration of the first deep well 510.

Please still refer to FIGS. 10-11. The ESD protection semiconductor device 500 further includes a third doped region 542 and a base region 544 formed in the substrate 502 at the first side 530*a*. In detail, the third doped region 542 is formed in the source region 540S, and both the third doped region 542 and the source region 540S are formed in the base region 544. Furthermore, the base region 544 is formed in the second deep well 512 as shown in FIGS. 10-11. The third doped region 542 and the base region 544 both include the first conductivity type, however a concentration of the third doped region 542 is larger than a concentration of the base region 544. Additionally, the concentration of the third doped region 544 in the first side 530*a* is higher than a concentration of the second doped region 552 in the second side 530*b*.

Additionally, in some modification to the preferred embodiment, the gate 530 can include a first gate line (not shown) and the second gate line (not shown), and the source region 540S is formed in between the first gate line and the second gate line. Also in such modification, the ESD protection semiconductor device includes only one deep well (not shown), and the source region 540S, the third doped region 542, the base region 544, the drain region 540D, the second doped region 552, and the first doped region 550 are formed in the deep well.

According to the semiconductor device 500 provided by the fifth preferred embodiment, the first doped region 550 is provided at the drain side, and the drain region 540D is spaced apart from at least the first isolation structure 520 by a portion of the first doped region 550. Furthermore, the second doped region 552 is formed under the drain region 540D. Therefore electric fields generated during operation are pushed away from the edge between the first isolation structure 520 and the drain region 540D. In other words, the first doped region 450 helps to shift the electric fields away from the drain region 540D. Consequently, the ESD protection semiconductor device 500 provided by the fifth preferred embodiment and modification efficiently avoids the electric fields crowding effect. Therefore, soft-leakage issue is avoided and the robustness of the provided ESD protection semiconductor device 500 is improved.

According to the ESD protection semiconductor devices provided by the present invention, the drain region is spaced apart from the first isolation structure by a portion of the first doped region. Accordingly, the electric field is pushed away from the edge of the gate. In other words, the semiconductor device provided by the present invention efficiently avoids the maximum electric fields crowding between the drain region and the first isolation structure. Therefore, soft-leakage issue is avoided and thus stability and robustness of the provided ESDE protection semiconductor device are both improved. Furthermore, the abovementioned scheme can be integrated in different approaches, for example in an ESD protection semiconductor device including racetrack-shaped gate or multi-gate line. Furthermore, though the abovementioned ESD protection semiconductor devices include the drain and the common source, ESD protection semiconductor devices include the source and the common drain is also applicable. In other words, the ESD protection semiconductor devices provided by the present invention further improve product flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection semiconductor device comprising:
   a substrate comprising a first conductivity type;
   a first isolation structure formed in the substrate;
   a gate disposed on the substrate, and the gate overlapping a portion of the first isolation structure;
   a source region formed in the substrate at a first side of the gate, the source region comprising a second conductivity type complementary to the first conductivity type;
   a first doped region formed in the substrate at a second side of the gate opposite to the first side, and the first doped region comprising the second conductivity; and
   a drain region formed in the first doped region and spaced apart from the first isolation structure by a portion of the first doped region, and the drain region comprising the second conductivity type.

2. The ESD protection semiconductor device according to claim 1, wherein a concentration of the first doped region is smaller than a concentration of the drain region and a concentration of the source region.

3. The ESD protection semiconductor device according to claim 1, wherein the drain region is spaced apart from the substrate by a portion of the first doped region.

4. The ESD protection semiconductor device according to claim 1, further comprising a second isolation structure, and the drain region being disposed in between the first isolation structure and the second isolation structure.

5. The ESD protection semiconductor device according to claim 4, wherein the drain region contacts the second isolation structure.

6. The ESD protection semiconductor device according to claim 4, wherein the drain region is spaced apart from the second isolation structure by a portion of the first doped region.

7. The ESD protection semiconductor device according to claim 1, wherein the drain region comprising a plurality of doped islands arranged along a direction parallel with an extending direction of the gate.

8. The ESD protection semiconductor device according to claim 7, wherein the doped islands are spaced apart from each other by a portion of the first doped region.

9. The ESD protection semiconductor device according to claim 1, further comprising a second doped region formed in the first doped region, and the second doped region comprising the first conductivity type.

10. The ESD protection semiconductor device according to claim 9, wherein the second doped region is sandwiched in between a portion of the first doped region and the drain region in a substrate-thickness direction.

11. The ESD protection semiconductor device according to claim 9, further comprising a third doped region formed in the source region, and the third doped region comprising the first conductivity type.

12. The ESD protection semiconductor device according to claim 11, wherein a concentration of the third doped region is higher than a concentration of the second doped region.

13. The ESD protection semiconductor device according to claim 11, further comprising a base region formed in the substrate, and the base region comprising the first conductivity type.

14. The ESD protection semiconductor device according to claim 13, wherein the source region and the third doped region are formed in the base region.

15. The ESD protection semiconductor device according to claim 1, further comprising a first deep well formed in the substrate, and the first deep well comprising the second conductivity type.

16. The ESD protection semiconductor device according to claim 15, wherein the drain region, the first doped region and the source region are formed in the first deep well.

17. The ESD protection semiconductor device according to claim 15, further comprising a second deep well formed in the substrate, and the second deep well comprising the first conductivity type.

18. The ESD protection semiconductor device according to claim 17, wherein the drain region and the first doped region are formed in the first deep well, and the source region is formed in the second well.

19. The ESD protection semiconductor device according to claim 1, wherein the gate comprises a racetrack-shape gate, the first side is an inner side of the racetrack-shaped gate, and the second side is an outer side of the racetrack-shaped gate.

20. The ESD protection semiconductor device according to claim 1, wherein the gate comprises a first gate line and a second gate line, and the source region is formed in between the first gate line and the second gate line.

* * * * *